United States Patent

Mizukami et al.

Patent Number: 5,544,122
Date of Patent: Aug. 6, 1996

[54] MULTIPLEXED MULTI-WRITE PORT SEMICONDUCTOR MEMORY

[75] Inventors: Masao Mizukami, Yokohama; Yoichi Sato, Iruma; Satoshi Shinagawa, Akishima; Yukio Nakano, Zama, all of Japan

[73] Assignees: Hitachi, Ltd.; Hitachi VLSI Engineering Corp., both of Tokyo, Japan

[21] Appl. No.: 246,267

[22] Filed: May 19, 1994

Related U.S. Application Data

[63] Continuation of Ser. No. 932,678, Aug. 20, 1992, abandoned.

[30] Foreign Application Priority Data

Aug. 30, 1991 [JP] Japan ................................. 3-244851

[51] Int. Cl.⁶ .................................................. G11C 8/00
[52] U.S. Cl. .............................. 365/230.05; 365/230.01; 365/230.06; 365/154
[58] Field of Search .................. 365/230.01, 230.05, 365/189.01, 189.04, 230.06, 154

[56] References Cited

U.S. PATENT DOCUMENTS

| | | |
|---|---|---|
| 5,036,491 | 7/1991 | Yamaguchi .......................... 365/189.07 |
| 5,265,045 | 11/1993 | Nishio et al. ................... 365/189.01 X |
| 5,349,564 | 9/1994 | Miyake et al. ....................... 365/230.05 |
| 5,359,562 | 10/1994 | Yasui et al. .............................. 365/154 |

FOREIGN PATENT DOCUMENTS

| | | | |
|---|---|---|---|
| 54-34726 | 3/1979 | Japan . | |
| 0177195 | 7/1990 | Japan .................................... | 365/154 |

Primary Examiner—David C. Nelms
Assistant Examiner—Huan Hoang
Attorney, Agent, or Firm—Fay, Sharpe, Beall, Fagan, Minnich & McKee

[57] ABSTRACT

Write column selection MOSFETs of memory cells MC are coupled with, for example, the earth potential of the circuit. Write column selection signals supplied to these MOSFETs are formed selectively according to the column selection address signal and the write data. Thereby the write column selection MOSFETs of the memory cells MC function as a substantial write means. That is, the write column selection signal lines are used as the data lines at the same time.

31 Claims, 11 Drawing Sheets

5,544,122

MULTIPLEXED MULTI-WRITE PORT SEMICONDUCTOR MEMORY

This is a continuation application of Ser. No. 07/932,678, filed Aug. 20, 1992, now abandoned.

BACKGROUND OF THE INVENTION

The present invention relates to semiconductor memory devices, for example, to a specifically effective technique to be available for on chip type multi-port memories etc. which are used as time switches of time sharing digital exchangers.

There is a multi-port memory having one or a plurality of write ports and read ports. Also, there is a time sharing digital exchanger using such a multi-port memory as a time switch. Further, as one means intended for low consumption power of a multi-port memory, there is so-called single memory cell selection system where memory cells constituting memory arrays are made selection states alternatively according to row and column selection signals.

A multi-port memory cell in single memory cell selection system is disclosed, for example, in Japanese patent application laid-open No. 34726/1979.

SUMMARY OF THE INVENTION

An object of the present invention is to provide a multi-port memory or the like where the required number of signal lines of memory arrays is reduced and the write operation margin is enlarged.

Another object of the present invention is to reduce the chip area of multi-port memories etc. as well as logic integrated circuit devices etc. bearing them, and to promote low voltage of the operation power source.

Further object of the present invention is to provide a multi-port memory having new function suitable for a time switch of a time sharing digital exchanger.

The foregoing and other objects and novel features of the present invention will become clear from the description of the specification and the accompanying drawings.

Outline of representative one of inventions disclosed in this application will be briefly explained as follows. Memory cells constituting memory arrays of a multi-port memory become single selection type memory cells selected alternatively at least during the write operation, and one of column selecting MOSFETs for writing into the above cells is terminated, for example, to the earth potential of the circuit and column selecting signals for writing supplied to the gate thereof are formed selectively according to the write data corresponding at least to column selecting address signals. Also, a data line for reading with memory cells connected selectively thereto is made a single signal line and a dummy data line with a dummy cell connected selectively thereto is provided, and a differential type sense amplifier is provided where a pair of its input terminals are connected to the reading data line and the dummy data line. Further, the multi-part memory in such constitution is provided with a plurality of writing ports having function that the write operation for a plurality of addresses continuing in the column direction is executed in time sharing.

According to the above-mentioned means, column selection MOSFETs for writing memory cells can function as substantial writing means and the write operation margin of a multi-port memory can be enlarged, and selection signal lines for writing can serve also as data lines for writing and the required number of signal lines of memory arrays can be reduced. Also, while the read operation or the multi-port memory is stabilized, unification of data lines for reading can be intended and the required number of signal lines of memory arrays can be further reduced. Further, the multi-port memory can have so-called multiplex function so that communication data transmitted through, for example, a plurality of highways are multiplexed on one super highway, and function of the time sharing digital exchanger as a time switch can be improved.

DESCRIPTION OF THE PREFERRED EMBODIMENTS

Figure 1:
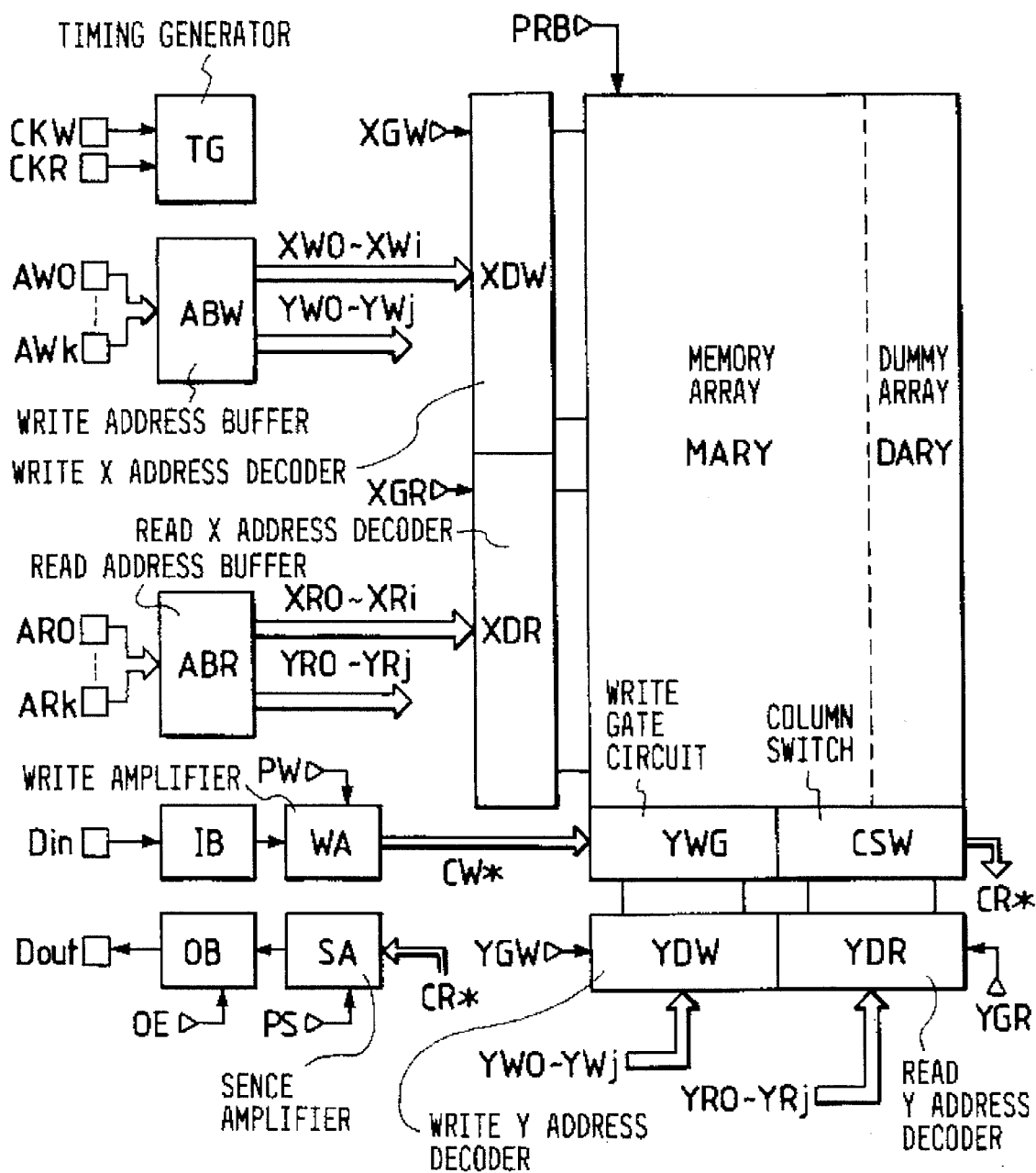
FIG. 1 is a block diagram indicating a first embodiment of a multi-port memory to which the invention is applied.

FIG. 1 indicated a block diagram of a first embodiment of a multi-port memory to which the invention is applied. Based on this block diagram, outline of block constitution and operation of a multi-port memory of the embodiment will be first described. The multi-port memory of the embodiment is mounted as an on-chip memory on a logic integrated circuit device included in a subscriber line circuit of a time sharing digital exchanger. Circuit elements constituting each block in FIG. 1, together with other circuit element (not shown) constituting the logic integrated circuit device, are formed on one semiconductor substrate such as P type single crystal silicon. Also in a circuit diagram as hereinafter referred to, MOSFET (metal oxide semiconductor type field effect transistor. The term MOSFET in this specification shall be a general term for insulation gate type field effect transistors.) with an arrow sign attached to its channel (back gate) parts is P-channel type and is discriminated from N-channel MOSFET being not attached with an arrow sign.

In FIG. 1, the multi-port memory of the embodiment is made a 2-port memory, whose two access ports are exclusively used as a write port and a read port respectively. Among those, the write port is supplied with a write clock signal CKW becoming a starting control signal from a front stage circuit (not shown) of the logic integrated circuit device, and is further supplied with write data of one bit, that is, input data Din and write address signals AW0–AWk of k+1 bits. Also the read port is supplied with a read clock signal CKR becoming a starting control signal from the front stage circuit, and is supplied with read address signals AR0–ARk of k+1 bits. The read signal of one bit outputted from the read port is supplied as output data Dout to a rear stage circuit (not shown) of the logic integrated circuit device.

The multi-port memory is constituted basically of a memory array MARY and a dummy array DARY with occupy the greater part of necessary area of layout. It is also provided with a write address buffer ABW, a write X address decoder (XDW, a write Y address decoder YDW, a write gate circuit YWG, a write amplifier WA and a data input buffer IB corresponding to the write port, and is provided with a read address buffer ABR, a read X address decoder XDR, a read Y address decoder YDR, a column switch CSW, a sense amplifier SA and a data output buffer OB corresponding to the read port.

Here, the memory array MARY, as hereinafter described, includes write X word lines of m+1 pieces (write row selection signal lines) and read X word lines (read row selection signal lines) arranged in parallel to the horizontal direction in FIG. 1 and write complementary Y word lines of n+1 pieces arranged in parallel to the vertical direction. Static type memory cells MC of (M+1)×(n+1) pieces are arranged in lattice shape on cross points of these X word lines as well as the complementary Y word lines and the read data lines.

On the other hand, the dummy array DARY, as hereinafter described, includes one dummy data line DRD arranged in the vertical direction in FIG. 1, and also includes dummy cells DC of m+1 pieces arranged on the cross points of the dummy data line and the read X word lines.

The write X word lines constituting the memory array MARY are connected to the write X address decoder XDW. The write X address decoder XDW is supplied with inside address signals XW0 XWi of i+1 bits from the write address buffer ABW, and supplied with an inside control signal XGW from the timing generator TG. Here, the inside control signal XGW normally at low level, and becomes high level at the prescribed timing when the write port of the multi-port memory becomes selection conditions by receiving the high level of the write clock signal CKW.

The write X address decoder XDW becomes operating condition selectively, when the write port of the multi-port memory becomes selection condition and the inside control signal XGW becomes high level. In this operation condition, the write X address decoder decodes the inside address signals XW0–XWi, and the corresponding write X word line of the memory array MARY becomes selection condition of high level alternatively.

The write address buffer ABW takes write address signals AW0–AWk of k+1 bits supplied from the front stage circuit (not shown) of the logic integrated circuit and holds them. Also, based on these write address signals, it forms the inside address signals XW0–XWi of i+1 bits and the inside address signals YW0–YW, of j+1 bits (write column address signals). Among these, the inside address signals XW0–XWi are supplied to the write X address decoder XDW as described above, and the inside address signals YW0–YWj are supplied to the write Y address decoder YDW as described below.

Also the read X word lines constituting the memory array MARY are coupled to the read X address decoder XDR. The read X address decoder XDR is supplied with the inside address signals XR0–XRi of i+1 bits from the read address buffer ABR, and supplied with the inside control signal XGR from the timing generator TG. Here, the inside control signal XGR is normally made low level, and is made high level at the prescribed timing when the read port of the multi-port memory receives high level of the read clock signal CKR and becomes selection condition.

The read X address decoder XDR becomes operating condition selectively, when the read port of the multi-port memory becomes selection state and the inside control signal XGR is made high level. Under this operating condition, the read X address decoder XDR decodes the inside address signals XR0–XRi, and the corresponding read X word line of the memory array MARY is made selection condition of high level alternatively.

The read address buffer ABR takes read address signals AR0–ARk of k+1 bits supplied from the front stage circuit (not shown) and holds them. Also based on these read address signals, it forms the inside address signals XR0–XRi of i+1 bits and the inside address signals YR0–YRj of j+1 bits. Among them, the inside address signals XR0–XRi are supplied to the read X address decoder XDR, and the inside address signals YR0–YRj are supplied to the read Y address decoder YDR as described below.

Next, the write complementary Y word lines constituting the memory array MARY are coupled with the write gate circuit YWG. The write gate circuit YWG, as hereinafter described, is supplied with write reversion data line selection signals of n+1 bits from the write Y address decoder YDW, and supplied with complementary write signals from the write amplifier WA through a write complementary common data line CW* (Here, for example, the write non-reversion common data line CW and the reversion common data line CWB together are expressed as the write complementary common data line CW* by attaching the sign *. Also regarding so-called reversion signals or reversion signal lines etc. becoming low levels selectively when they are effective, symbol B is attached to the end of each designation, and so forth.). The write Y address decoder YDW is supplied with the inside address signals YW0–YWj of j+1 bits from the write address buffer ABW, and supplied with the inside control signal YGW from the timing generator TG. Here, the inside control signal YGW is normally made low level, and is made high level at the prescribed timing when the write port of the multi-port memory becomes selection condition.

The write Y address decoder YDW is made operation condition selectively, when the write port of the multi-port memory becomes selection condition and the inside control signal YGW becomes high level. In this operation condition, the write Y address decoder YDW decodes the inside address signals YW0–YWj, and the corresponding write reversion data line selection signal is made selection state of low level alternatively.

The write gate circuit YWG combines the write reversion data line selection signal supplied from the write Y address decoder YDW and the complementary write signal supplied from the write amplifier WA through the write complementary common data line CW*, thereby non-reversion or reversion signal line of the corresponding write complementary Y word line of the memory array MARY is made selection condition of high level alternatively.

The write complementary common data line CW* is connected to the output terminal of the write amplifier WA. The input terminal of the write amplifier WA is connected to the output terminal of the data input buffer IB, and the input terminal of the data input buffer IB is supplied with the input data Din from the front stage circuit (not shown) of the logic integrated circuit device. The write amplifier WA is supplied with the inside control signal PW from the timing generator TG. Here, the inside control signal PW becomes high level temporarily at the prescribed timing, when the write port of the multi-port memory becomes selection condition.

The data input buffer IB takes the input data Din supplied from the front stage circuit (not shown) of the logic integrated circuit device and transmits them to the write amplifier WA, when the write port of the multi-port memory becomes selection condition. The write amplifier WA is made operation condition selectively, when the write port of the multi-port memory becomes selection condition and the inside control signal PW becomes high level. In this operation condition, based on the write data transmitted from the data input buffer IB, the write amplifier WA forms a predetermined complementary write signal and supplies it through the write complementary common data line CW* to the write gate circuit YWG.

On the other hand, the read data line constituting the memory array MARY is connected to the corresponding switch MOSFET of the column switch CSW as hereinafter described, and is further connected to the non-reversion signal line of the read complementary common data line CR* selectively. The dummy data line DRD of the dummy array DARY is selectively connected to the reversion signal line of the read complementary common data line CR*. Gates of each pair of the switch MOSFETs of the column switch CSW are commonly coupled respectively, and the corresponding read data line selection signal is supplied from the read Y address decoder YDR. The read Y address decoder YDR is supplied with inside address signals YR0--YRj from the read address buffer ABR, and supplied with a inside control signal YGR is normally made low level, and is made high level at the prescribed timing when the read port of the multi-port memory becomes selection state.

The read Y address decoder YDR is set to operation condition selectively, when the read port of the multi-port memory is set to selection condition and the inside control signal YRG is made high level. In this operating condition, the read Y address decoder YDR decodes the inside address signals YR0-YRj, and the corresponding read data line selection signal is made high level alternatively.

The read common data line CR* is each coupled to non-reversion and reversion input terminals of the sense amplifier SA. The output terminal of the sense amplifier SA is coupled to the input terminal of the data output buffer OB, and the output signal of the data output buffer OB is supplied as output data Dout to the rear stage circuit (not shown) of the logic integrated circuit device. The sense amplifier SA is supplied with the inside control signal PS from the timing generator TG, and the data output buffer OB is supplied with the inside control signal OE. Here, the inside control signal PS is normally made low level, and is made high level at the prescribed timing when the read port of the multi-port memory is set to selection state. Also the inside control signal OE is normally made low level, and is made high level a little later than the inside control signal PS.

The sense amplifier SA is set to operation condition selectively, when the read port of the multi-port memory is set to selection condition and the inside control signals PS is made high level. In this operation condition, the sense amplifier SA amplifies the read signal outputted from the selected memory cell MC of the memory array MARY through the corresponding read data line and the non-reversion signal line of the read complementary common data line CR*, comparing it with the reference signal outputted from the selected dummy cell DC of the dummy array DARY through the dummy data line and the reversion signal line of the read common data line CR*, and transmits the amplified signal as the read data to the data output buffer OB.

The data output buffer OB is set to operation condition selectively, when the read port of the multi-port memory is made selection state and the inside control signal OE is made high level. In this operation condition, the data output buffer OB further amplifies the read data outputted from the sense amplifier SA, and then transmits the amplified data as the output data Dout to the rear stage circuit (now shown) of the logic integrated circuit device.

The timing generator TG forms the above-mentioned various inside control signals on the basis of the write clock signal CKW and the read clock signal CKR being supplied as starting control signals from the front stage circuit (not shown) of the logic integrated circuit device, and supplies the control signals to each part of the multi-port memory.

Figure 2:
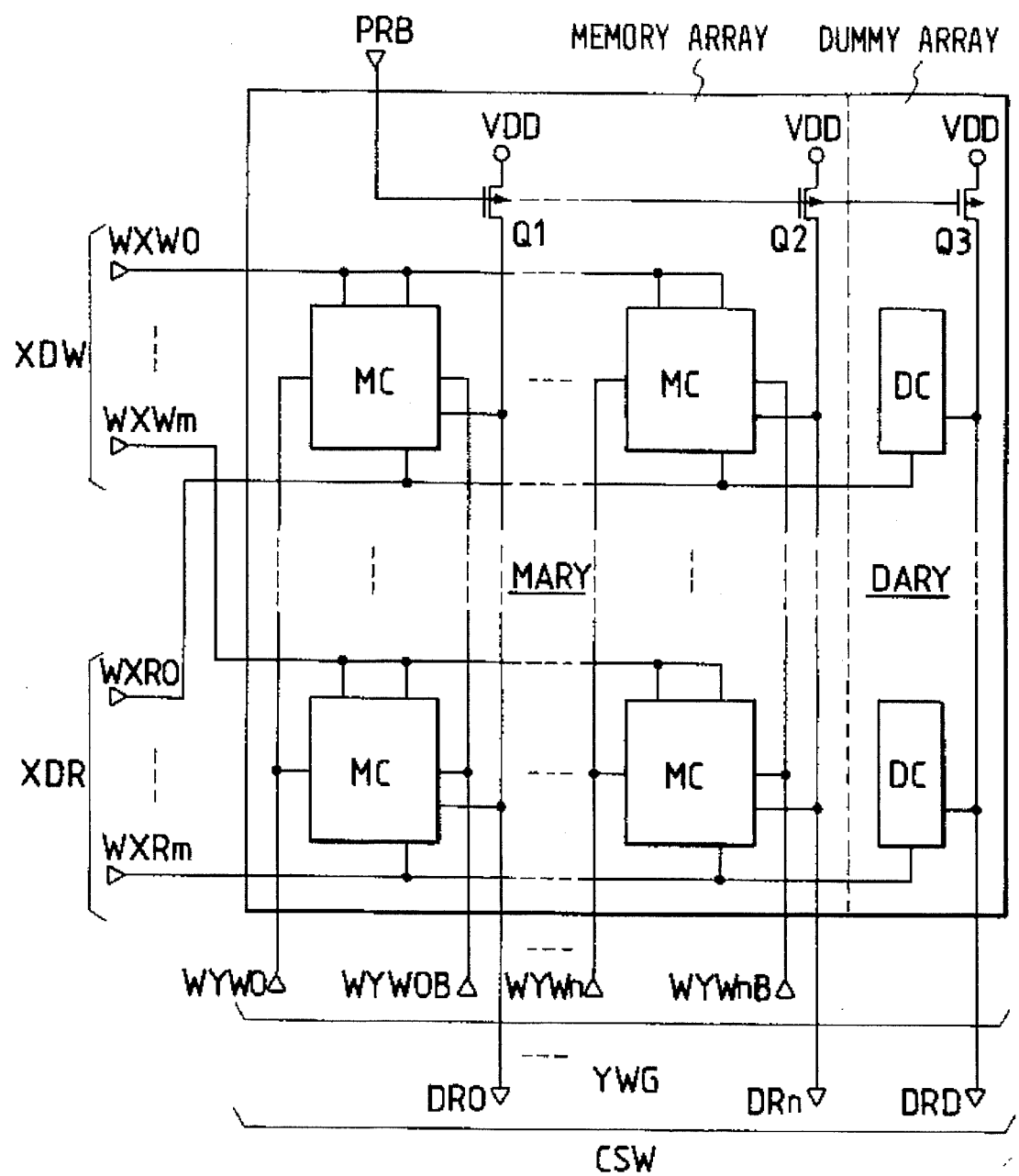
FIG. 2 is a circuit block diagram indicating an embodiment of a memory array and a dummy array included in the multi-port memory in FIG. 1.
Figure 3:
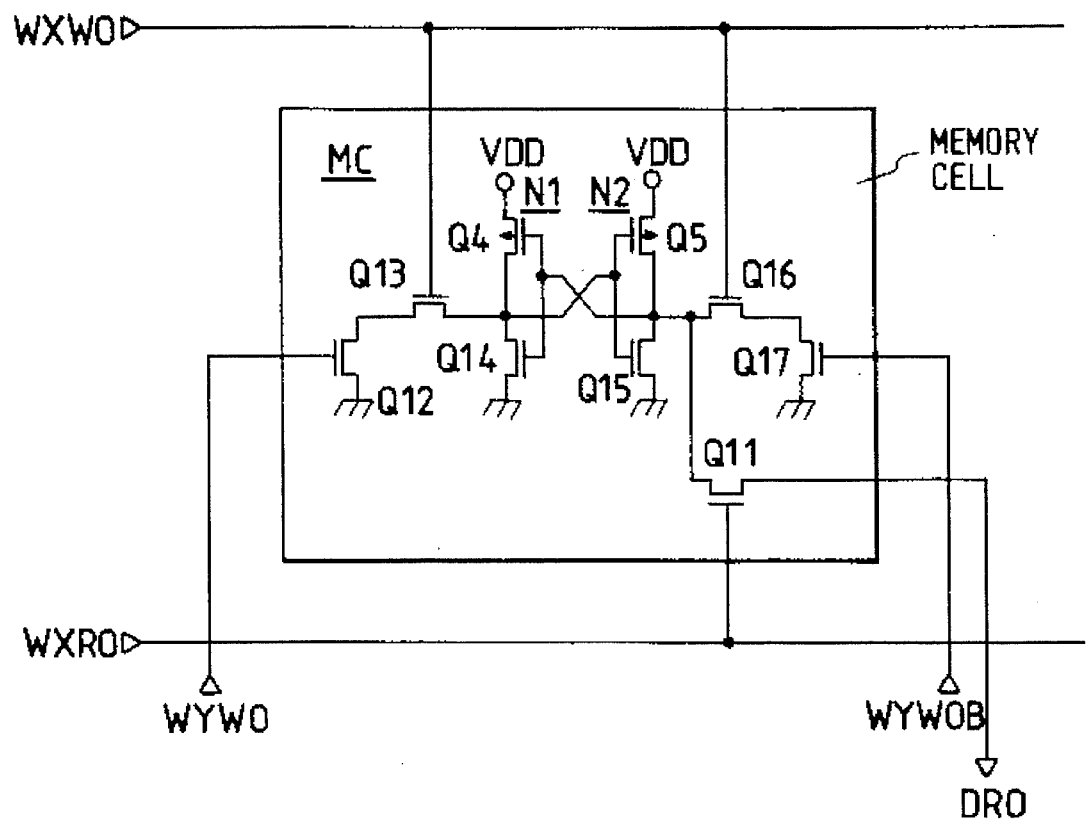
FIG. 3 is a circuit diagram indicating an embodiment of a memory cell included in the memory array in FIG. 2.

FIG 2 indicates a circuit block diagram of an embodiment of a memory array MARY and a dummy array DARY included in the multi-port memory in FIG. 1. FIG. 3 indicates a circuit diagram of an embodiment a memory cell MC included in the memory array MARY in FIG. 2, and FIG. 4 indicates a circuit diagram of an embodiment of a dummy cell DC included in the dummy array DARY in FIG. 2.

In FIG. 2, the memory array MARY of the multi-port memory of this embodiment includes the write X word lines WXW0–WXWm of m+1 pieces and the read X word lines WXR0–WXRm arranged in parallel to the horizontal direction of FIG. 2, and the write complementary Y word lines WYW0*–WYWn* of n+1 sets and the read data lines DR0–DRn of n+1 pieces arranged in parallel to the vertical direction. Static type memory cells MC of (m+1)×(n+1) pieces are arranged in lattice shape on the intersection points of these X word lines and lines as well as the data lines.

Here, each of memory cells MC constituting a memory array MARY has a latch circuit as its fundamental constitution where a pair of CMOS inverters N1 and N2 composed of P-channel MOSFET Q4 and N-channel MOSFET Q14 as well as P-channel MOSFET Q5 and N-channel MOSFET Q15 are cross-linked as indicated in FIG. 3. Among those, a commonly coupled node of the input terminal of the inverter N1 and the output terminal of the inverter N2 becomes a non-reversion input/output node of each latch circuit, and is coupled with the earth potential (the first source voltage) of the circuit through the two N-channel MOSFETs Q16 (the second switching means) and Q17 (the first switching means) in series form, and is coupled with corresponding read data lines DR0–DRn through N-channel MOSFET Q11 (the third switching means). Also, the commonly coupled node of the output terminal of the inverter N1 and the input terminal of the inverter N2 becomes a reversion input/output node of each latch circuit, and is coupled with the earthing potential of the circuit through the two N-channel MOSFETs Q13 (the second switching means) and Q12 (the first switching means) in series configuration.

Gates of the MOSFETs Q13 and Q16 are commonly coupled with corresponding write X word lines WXW0–WXWn, and gates of the MOSFETs Q12 and Q17 commonly coupled with non-reversion or reversion signal line of the corresponding write complementary Y word lines WYWn–WYWB respectively. The gate of the MOSFET Q11 is commonly coupled with the corresponding read X word lines WXR0–WXRm. As a result, the MOSFETs Q13 and Q16 act as the write row selection MOSFET, and the MOSFET Q11 acts as the read row selection MOSFET. Also, the MOSFETs Q12 and Q17 act as the write column selection MOSFET and further as the substantial writing means to provide the latch circuit composed of the inverters N1 and N2 with the write currents according to the write data.

In this embodiment, the write X word lines WXW0–WXWm are normally set to non-selection condition of low level, and are set to selection condition of high level alternatively according to the inside address signals when the write port of the multi-port memory is in selection condition. Also, the read X word lines WXR0–WXRm are normally set to non-selection condition of low level, and are set to selection condition of high level alternatively according to the inside address signals XR0–XRi when the read port of the multi-port memory is in selection condition. On the other hand, the write complementary Y word lines WYW0*–WYWn* together are normally set to non-selection condition of low level, and either of their non-reversion or reversion signal lines is made high level selectively according to the inside address signals YW0–YWj and the input data Din when the write port of the multi-port memory is in selection condition. Further, read data lines DR0–DRn are selectively connected to the non-reversion signal line of the read complementary common data line CR* through a column switch CSW described below on the one hand, and is coupled with the supply voltage VDD through the corresponding P-channel type precharge MOSFETs Q1 on the other hand. A reversion inside control signal PRB is supplied from the timing generator TG to the gate of these precharge MOSFETs. The supply voltage VDD is a positive supply voltage having relatively small absolute value such as +3.3 V. Also, the reversion inside control signal PRB is normally made low level, and is made high level at the prescribed timing when the read port of the multi-port memory becomes selection condition.

Next, the dummy array DARY includes one dummy data line DRD, and also includes dummy cells DC of m+1 pieces arranged on the points of intersection of the dummy data line DRD and the read X word lines WXR0–WXRm.

Figure 4:
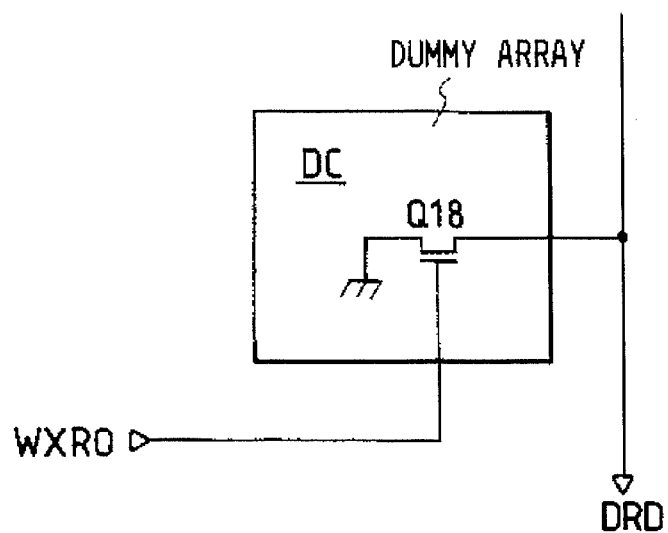
FIG. 4 is a circuit diagram indicating an embodiment of a dummy cell included in the dummy array in FIG. 2.

Here, each of the dummy cells DC constituting the dummy array DARY includes N-channel MOSFET Q18 provided between the dummy data line DRD and the earth potential of the circuit as illustrated in FIG. 4. The gates of the MOSFET Q18 are coupled with the corresponding read X word lines WXR0–WXRm respectively.

The dummy data line DRD is selectively connected to the reversion signal line of the read complementary common data line CR* through a column switch CSW described below on one end, and is coupled with the supply voltage VDD through the P-channel type precharge MOSFET Q3 on the other end. The reversion inside control signal PRB is supplied to the gate of the precharge MOSFET Q3.

When the write port and the read port of the multi-port memory are set to non-selection condition, the write X word lines WXW0–WXWm and the read X word lines WXR0–WXRm as well as the the non-reversion and reversion signal lines of the write complementary Y word lines WYW0*–WYWn* together are set to selection condition of low level as described above, and the reversion inside control signal PRB becomes low level. Accordingly, in the memory array MARY and the dummy array DARY, the memory cells MC and the dummy cells DC are all set to non-selection condition, and the precharge MOSFETs Q1–Q3 are turned on simultaneously, and the read data lines DR0–DRn and the dummy data line DRD are precharged to such high level as that of the supply voltage VDD.

When the write port of the multi-port memory is set to selection state, the write X word lines WXW0–WXWm are made high level alternatively at the prescribed timing, and the non-reversion or reversion signal lines of the write complementary Y word lines WYW0*–WYWn* are made high level alternatively. Accordingly, in the memory array MARY, the write row selection MOSFETs Q13 and Q16 of the memory cell MC corresponding to the write X word line of high level are both turned on, and further the write column selection MOSFET Q12 or Q17 of the memory cell MC corresponding to the write non-reversion or reversion Y word lines of high level is turned on selectively. Thereby, only one memory cell MC designated by these X word line and complementary Y word line is set to selection condition alternatively, and a non-reversion or reversion input/output node of a latch circuit composed of the inverters N1 and N2 of the memory cell MC becomes low level like the earth potential of the circuit selectively, and the write operation is executed according to the input data Din.

That is, in the write port of the multi-port memory of this embodiment, memory cells MC constituting the memory array MARY are made so-called single selection type memory cell, and the write column selection MOSFETs Q12 and Q17 function as substantial writing means, and further the write complementary Y word lines WYW0–WYWn* are used as the write data lines as well. As a result, since the required number of signal lines of the memory array MARY is reduced and the write paths to the selected memory cells substantially become the two MOSFETs Q12 and Q13 or Q16 and Q17 only, the operation margin in the write port of the multi-port memory is enlarged. Thereby, while the write operation of the multi-port memory is stabilized, the chip area of the logic integrated circuit device bearing the multi-port memory is reduced, and the reduction of consumption power and cost can be promoted.

Next, when the read port of the multi-port memory is set to selection condition, the reversion inside control signal PRB is made high level at the prescribed timing, and the read X word lines WXR0–WXRm are made high level alternatively. Therefore, in the memory array MARY, the precharge MOSFETs Q1 are turned off and the read column selection MOSFET Q11 of the memory cell MC corresponding to the read X word line of high level is turned on, and the non-reversion input/output node of the latch circuit composed of the corresponding read data lines DR0–DRn. Thereby the read signal according to the holding data of the memory cells MC of n+1 pieces coupled with the selected read X word line is outputted to the corresponding read data lines DR0–DRn, and further transmitted to the non-reversion input terminal of the sense amplifier SA from the column switch CSW as hereinafter described through the non-reversion signal line of the read complementary common data line CR*. At this time, in the dummy array DARY, the MOSFET Q18 of the dummy cell DC corresponding to the read X word line of high level is turned on, and prescribed reference potential is outputted to the dummy data line DRD. This reference potential is outputted to the dummy data line DRD. This reference potential is transmitted from the column switch CSW through the reversion signal line of the read complementary common data line CR* to the reversion input terminal of the sense amplifier SA. As a result, in the multi-port memory of this embodiment, the sense amplifier SA can be constituted by so-called differential amplifier circuit, thereby the read operation of the multi-port memory can be stabilized.

Figure 5:
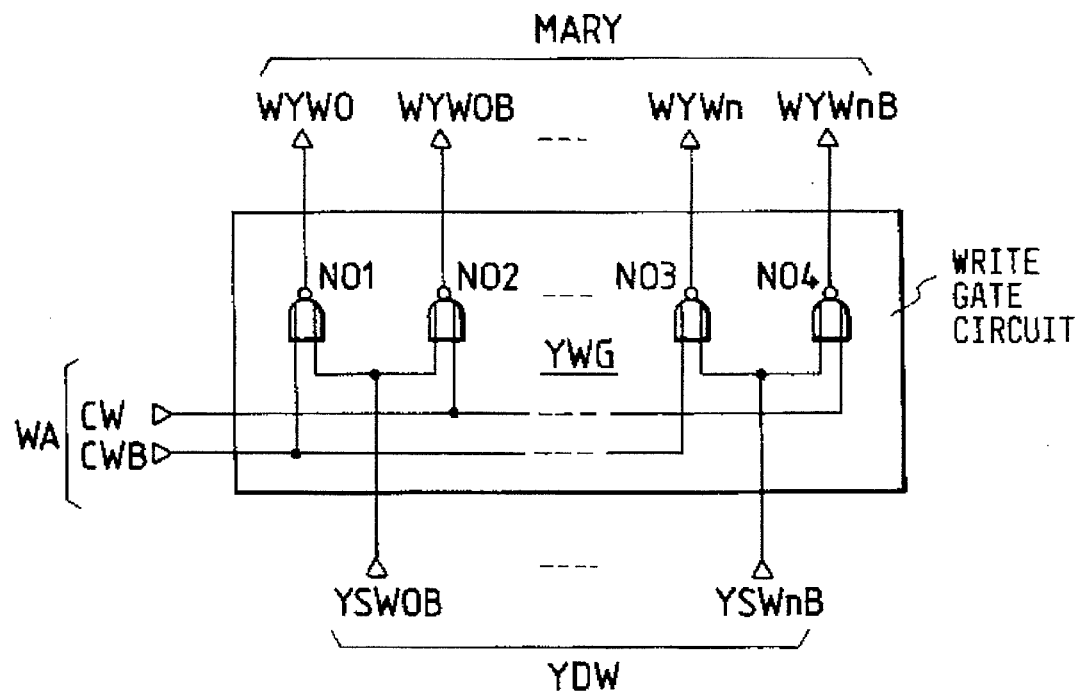
FIG. 5 is a circuit diagram indicating an embodiment of a writing gate circuit included in the multi-port memory in FIG. 1.
Figure 7:
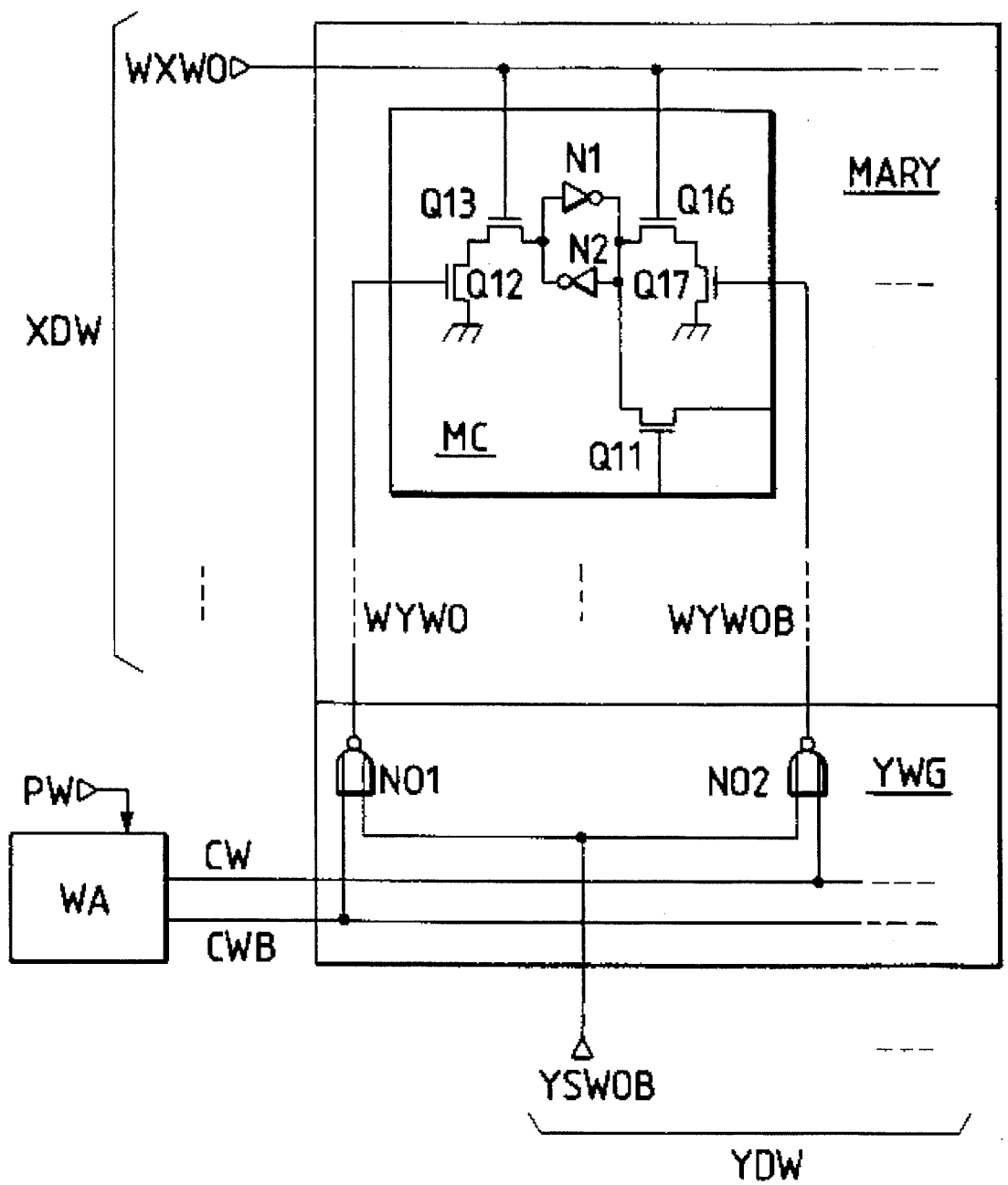
FIG. 7 is a connection diagram of a writing system circuit of the multi-port memory in FIG. 1.

FIG. 5 indicates a circuit diagram of an embodiment of a write gate circuit YWG included in the multi-port memory in FIG. 1. FIG. 7 indicates a connection diagram of an embodiment of a write system circuit of the multi-port memory in FIG. 1.

In FIG. 5, the write gate circuit YWG of the multi-port memory of this embodiment includes n+1 sets of NOR gates NO1 and NO2 to NO3 and NO4 corresponding to the write complementary Y word lines WYW0*–WYWn* of the memory array MARY. Among them, one input terminal of the odd numbered NOR gates NO1 to NO3 is commonly coupled with the reversion signal line of the write complementary common data line CW*, and one input terminal of the even numbered NOR gates NO2 to NO4 is commonly coupled with the non-reversion signal line. Other input terminal of each set of the NOR gates NO1 and NO2 and NO4 is commonly coupled, and the corresponding write reversion data line selection signals YSW0B–YSWnB are supplied respectively from the write Y address decoder YDW. Here, a write complementary common data line CW* becomes low level or high level selectively according to the input data Din, when the write port of the multi-port memory is set to selection condition. Also, the write reversion data line selection signals YSW0B–YSWnB together are normally made high level, and are made low level alternatively according to the inside address signals YW0–YWj (write column selection address signal) when the write port of the multi-port memory is set to selection condition.

When the write port of the multi-port memory is set to non-selection condition, the write reversion data line selection signals YS0B–YSnB together are made high level as described above. Therefore, in the write gate circuit YWG, all the NOR gates NO1–NO4 become non-transmission condition, and the non-reversion and reversion signals of the write complementary Y word lines WYW0*–WYWn* are set to non-selection state of low level.

On the other hand, when the write port of the multi-port memory is set to non-selection state, the write reversion data line selection signals YSW0B–YSWnB are made low level alternatively, and the non-reversion or reversion signal line of the write complementary common data line CW* is made low level selectively. Therefore, the NOR gates NO1 to NO3 or NO2 to NO4 corresponding to the write reversion data line selection signal of high level become transmission condition alternatively, and the non-reversion or reversion lines of the corresponding write complementary Y word lines WYW0*–WYWn* are set to selection condition of high level alternatively. As a result, the write paths as indicated in FIG. 7 are constituted in the multi-port memory, and MOSFET Q12 or Q17 of a selected memory cell MC is turned on selectively, and the write operation for the memory cell MC is executed alternatively.

Figure 6:
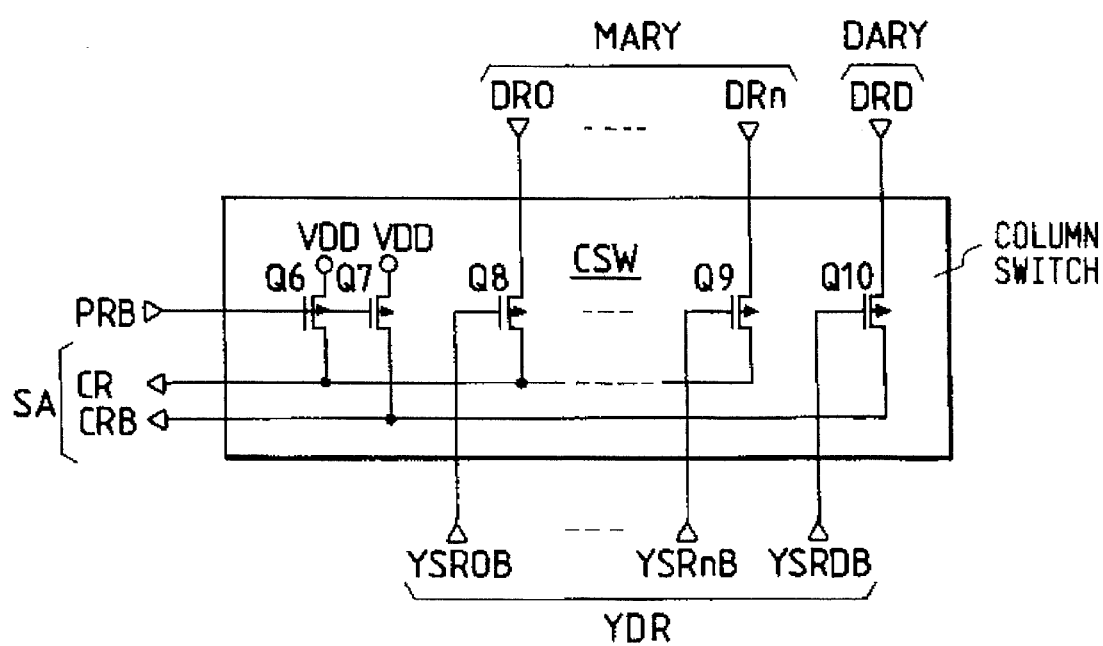
FIG. 6 is a circuit diagram indicating an embodiment of a column switch included in the multi-port memory in FIG. 1.

FIG. 6 indicates a circuit diagram of an embodiment of a column switch CSW included in the multi-port memory in FIG. 1. Also, FIG. 8 indicates a connection diagram of an embodiment of a read system circuit of the multi-port memory in FIG. 1.

In FIG. 6, the column switch CSW of the multi-port memory of this embodiment includes P-channel MOSFETs Q8–Q10 of n+2 pieces provided corresponding to read data lines DR0–DRn of a memory MARY and a dummy data line DRD of a dummy array DARY. Among them, each one side of the MOSFETs Q8–Q9 is coupled with the corresponding read data lines DR0–DRn of the memory array MARY respectively, and the other side thereof is commonly coupled with the non-reversion signal line of the read complementary common data line CR*. Also, one side of the MOSFET Q10 is coupled with the dummy data line DRD of the dummy array DARY, and the other side thereof is coupled with the reversion signal line of the read complementary common data line CR*. Corresponding read reversion line selection signals YSR0B–YSRnB or YSRDB are supplied from the read Y address decoder YDR to gates of these MOSFETs Q8–Q10 respectively. Non-reversion and reversion signal lines of the read complementary common data line CR* are coupled with non-reversion and reversion input terminals of the differential type sense amplifier SA respectively. The read reversion data line selection signals YSR0B–YSRnB are normally made high level, and are made low level alternatively according to inside address signals YR0–YRj when the read port of the multi-port memory is set to selection condition. The read reversion data line selection signal YSRDB is normally made high level, and is made low level at the prescribed timing when the read port of the multi-port memory is set to selection state.

The column switch CSW further includes two precharge MOSFETs Q6 and Q7 of P-channel type provided between the supply voltage VDD and the non-reversion and reversion lines of the read complementary common data line CR*. The reversion inside control signal PRB is supplied to gates of these MOSFETs.

When the read port of the multi-port memory is set to non-selection condition, the reversion inside control signal PRB is made low level as described above, and the read reversion data line selection signals YSR0B–YSRnB and YSRDB are all made high level. Therefore in the column switch CSW, the MOSFETs Q8–Q10 are turned off, and the precharge MOSFETs Q6 and Q7 are turned on. As a result, the read data lines DR0–DRn of the memory array MARY and the dummy data line DRD of the dummy array DARY are all set to non-selection condition, and the non-reversion and reversion signal lines of the read complementary common data line CR* are precharged to high level like that of the supply voltage VDD.

Figure 8:
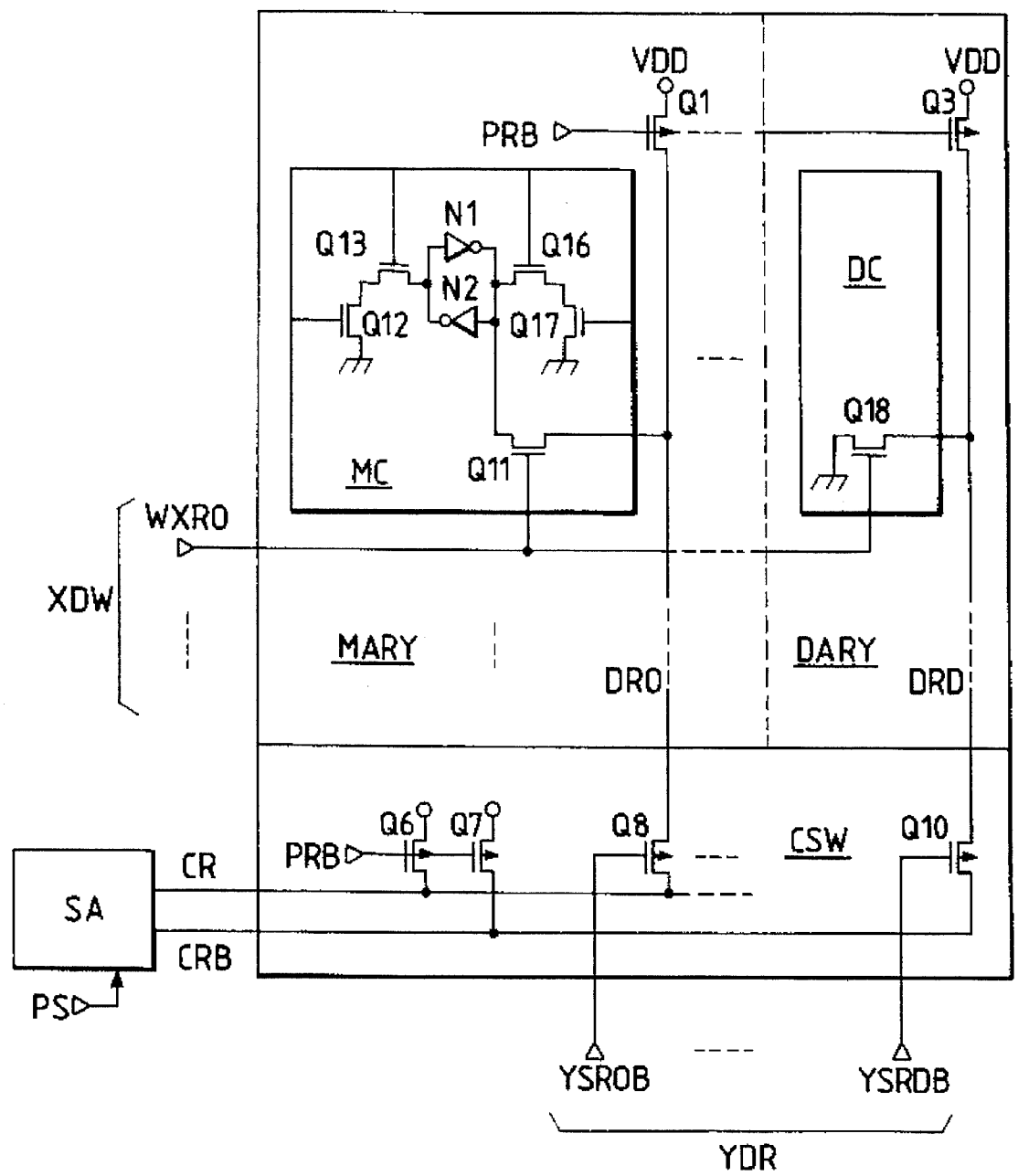
FIG. 8 is a connection diagram of a reading system circuit of the multi-port memory in FIG. 1.

When the read port of the multi-port memory is set to selection condition, the reversion inside control signal PRB is made high level at the prescribed timing, and the read reversion data line selection signals YSR0B–YSRnB are made low level alternatively and the read reversion data line selection signal YSRDB is made low level. Therefore in the column switch CSW, the precharge MOSFETs Q6 and Q7 are turned off, and the MOSFETs Q8–Q9 corresponding to the read reversion data line selection signal of low level are turned on and also the MOSFET Q10 is turned on. As a result, as shown in FIG. 8, the read data lines DR0–DRn of the memory array MARY are connected to the non-reversion input terminal of the sense amplifier SA through the non-reversion signal line of the read complementary common data line CR* alternatively, and the dummy data line DRD of the dummy array DARY is connected to the sense amplifier SA through the reversion signal line of the read complementary common data line CR* thereby the read system circuit of the multi-port memory is constituted.

Figure 9:
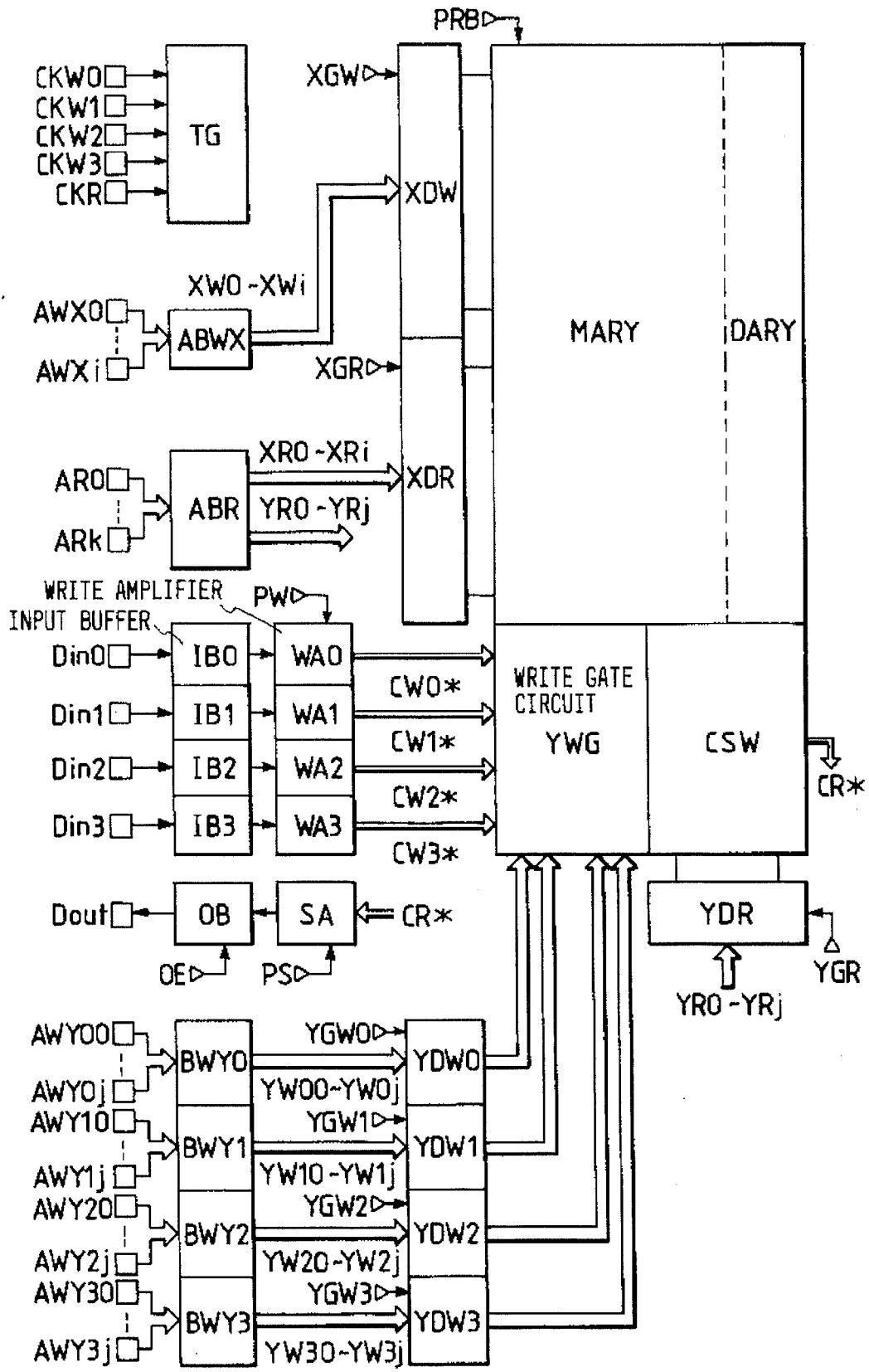
FIG. 9 is a block diagram indicating a second embodiment of a multi-port memory to which the invention is applied.

FIG. 9 indicates a block diagram of a second embodiment of a multi-port memory to which the present invention is applied. Also FIG. 10 indicates a circuit diagram of an embodiment of a write gate circuit YWG included in the multi-port memory in FIG. 9, and FIG. 11 indicates a timing chart of an embodiment in the write mode of the multi-port memory in FIG. 9. Explanation will be added to only parts different from embodiments described in FIGS. 1 to 8 as follows.

In FIG. 9, the multi-port memory of this embodiment is provided with one read port and write ports of s pieces, i.e., 4 pieces. Among them, the read port is supplied with a read clock signal CKR becoming starting control signal from a front stage circuit (not shown) of a logic integrated circuit device where the multi-port memory is mounted, and is supplied with read address signals AR0–ARk of k+1 bits. These read address signals are inputted to a read address buffer ABR, and then supplied as inside address signals XR0–XRi of i+1 bits and inside address signals YR0–YRj of j+1 bits to a read X address decoder XDR or a read Y address decoder YDR.

On the other hand, the write ports of the multi-port memory are supplied with write clock signals CKW0–CKW3 becoming starting control signals respectively, and supplied with write Y address signals AWY00–AWY0j to AWY30–AWY3j of j+1 bits respectively. These write Y address signals are inputted through corresponding column address input terminals to write address buffers BWY0–BWY3 (column address buffers), and then supplied as inside address signals YW00–YW0j to YW30–YW3j to corresponding write Y address decoders YDW0–YDW3 are further supplied with inside control signals YGW0–YGW3 from a timing generator TG respectively. Here, the inside control signals YGW0-YGW3 together are normally made low level, and are made high level at the prescribed timing when the corresponding write ports of the multi-port memory are set to selection condition on receiving high level of the write clock signals CKW0–CKW3.

The multi-port memory of this embodiment is further supplied with write X address signals AWX0–AWXj of i+1 bits being common to the four write ports. These write X address signals are inputted to the write X address buffer ABWX, and then supplied as inside address signals XW0–XWi to the write X address decoder XDW.

Figure 11:
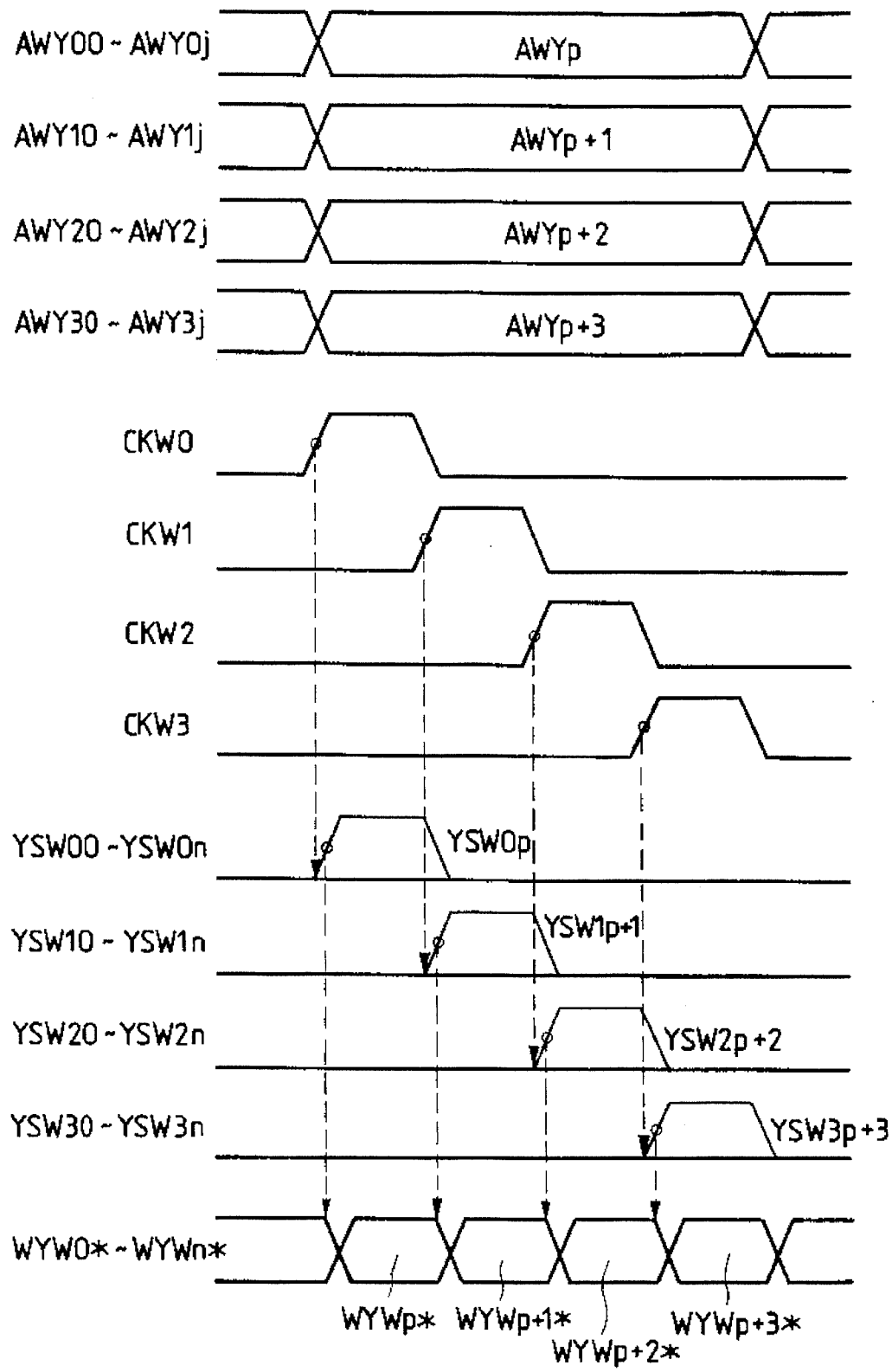
FIG. 11 is a timing chart in write mode of the multi-port memory in FIG. 9.

In the multi-port memory of this embodiment, the four write ports can be set to selection condition at the same time with the arbitrary combination. The write Y address signals AWY00–AWY0j to AWY30–AWY3j which are supplied to the write ports of four in number at most being set to selection state at the same time, as illustrated in FIG. 11, are presumed to be the signals designating, for example, continuous column addresses AWYp–AWYp+3. At this time, the write clock signals CKW0–CKW3, as illustrated in FIG. 11, are shifted in sequence with the prescribed timing and made high level, and the write Y address signals AWY00–AWY0j to AWY30–AWY3j are switched and changed in the period being the term until these write clock signals are all made high level.

Next, the multi-port memory of this embodiment is provided with four data input buffers IB0–IB3 and write amplifiers WA0–WA3 corresponding to the four write ports. Input terminals of the data input buffers IB0–IB3 are coupled with corresponding data input terminals Din0–Din3, and output terminals thereof are coupled with input terminals of the corresponding write amplifiers WA0–WA3. Output terminals of these write amplifiers WA0–WA3 are coupled with a write gate circuit YWG through corresponding write complementary common data lines CW0*–CW3*.

Figure 10:
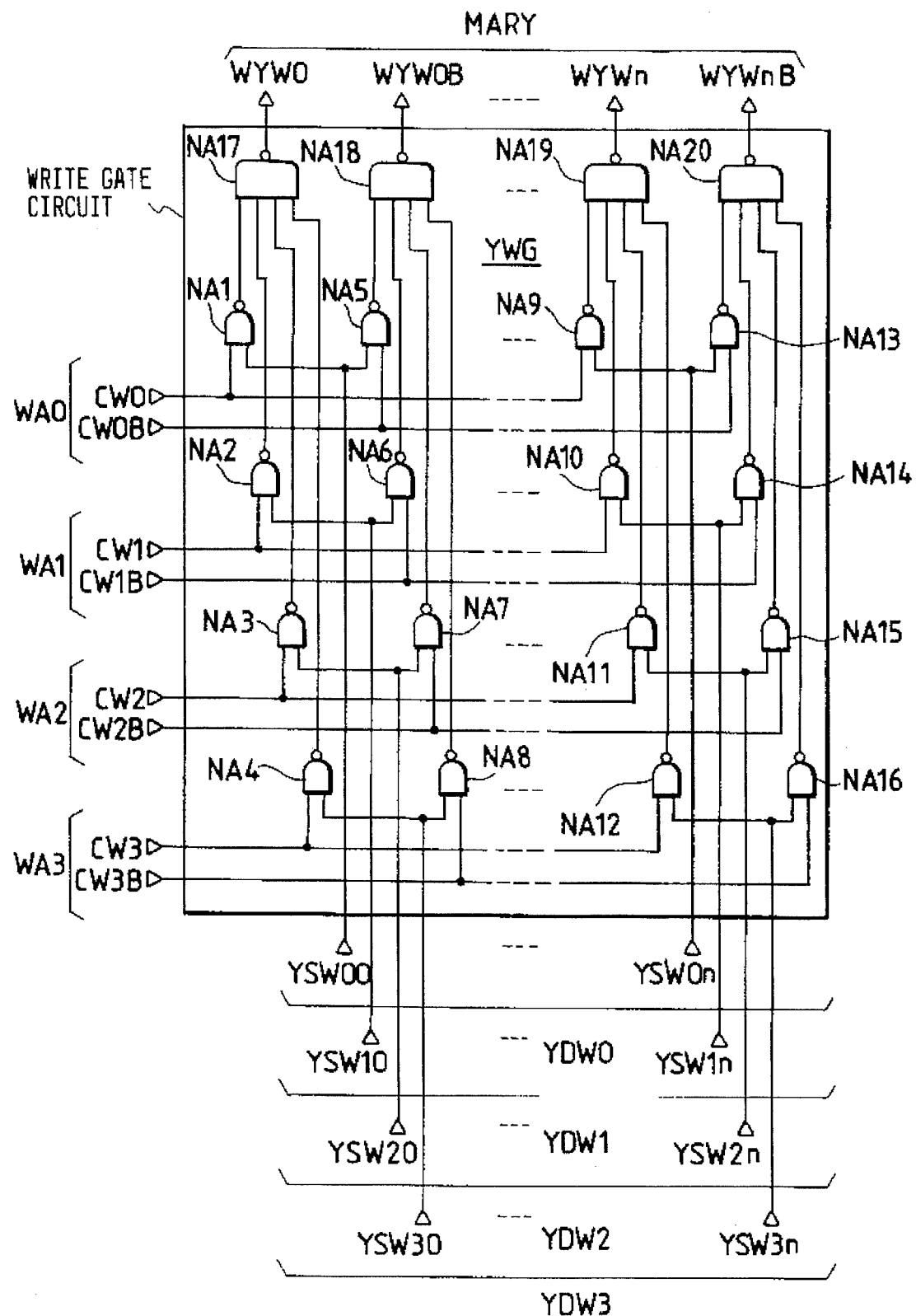
FIG. 10 is a circuit diagram indicating an embodiment of a writing gate circuit included in the multi-port memory in FIG. 9.

Here, the write gate circuit YWG, as indicated in FIG. 10, includes four-input NAND gates NA17–NA20 of 2×(n+1) pieces provided corresponding to the write complementary Y word lines WYW0*–WYWn* of the memory array MARY and NAND gates NA1–NA16 of total 8×(n+1) pieces provided every n+1 sets corresponding to the write complementary Y word lines and the write complementary common data lines CW0*–CW3*. Input terminals at one side of the NAND gates NA1–NA4 to N9–N12 provided corresponding to the write non-reversion Y word lines WYW0–WYWn of the memory array MARY are commonly coupled with non-reversion signal lines of the corresponding write complementary common data lines CW0*–CW3* respectively, and input terminals at one side of the NAND gates NA5–NA8 to NA13–NA16 provided corresponding to the reversion Y word lines WYW0B–WYWnB of the memory array MARY are commonly coupled with the reversion signal lines of the corresponding write complementary common data lines CW0*–CW3* respectively. Input terminals at the other side of the two NAND gates in a pair are commonly coupled respectively, and corresponding write data line selection signals YSW00–YSW0n to YSW30–YSW3n are supplied from corresponding write Y address decoders YDW0–YDW3 respectively. These write data line selection signals together are normally made low level, and when the corresponding write ports of the multi-port memory are set to selection state, they are made high level alternatively at the prescribed timing and according to the corresponding inside address signals YW00–YW0j to YW30–YW3j.

When the four write ports of the multi-port memory are set to non-selection condition, the inside control signals YGW0–YGW3 are all made low level and the write Y address decoders YDW0–YDW3 are set to non-operation condition. Therefore, the write data line selection signals YSW00–YSW0n to YSW30–YSW3n are all made low level, and the non-reversion and reversion signal lines of the write complementary Y word lines WYW0*–WYWn* of the memory array MARY are set to non-selection condition of low level.

When, for example, four write ports in the multi-port memory are set to selection condition, in each write port, as indicated in FIG. 11, on receiving high level of the corresponding write clock signals CKW0–CKW3, for example, the write data line selection signals YSW0p, YSW1p+1, YSW2p+2 and YSW3p+3 are sequentially set to high level alternatively. Therefore, first, on receiving high level of the write data line section signal YSW0p, the non-reversion or reversion signal lines of the write complementary Y word line WYWp* of the memory array MARY are set to high level selectively according to the input data Din0, and further, on receiving high level of the write data selection signals YSW1p+1 to YSW3p+3, the non-reversion or reversion signal lines of the write complementary word lines WYWp+1*–WYWp+3* of the memory array MARY are set to high level selectively. Thereby the write operation of the input data Din0–Din 3 is executed sequentially in the time sharing for the four addresses continuing to the column direction of the memory array MARY where the column address AWYp of the memory array MARY is the leading address.

For the above reason, the multi-port memory of this embodiment acts as so-called multi-port FIFO (First-In-First-Out) memory where the write data supplied through the four write ports are written in the time sharing into four addresses continuing to the column direction, thereby it is provided with so-called multiplex function. Therefore, for example, at the time sharing digital exchangers etc., exchange of time slot can be carried out while communication data transmitted through four highways are multiplexed on one super highway. As a result, constitution of the time sharing digital exchangers etc. can be simplified and speedy operation of its transmission route can be realized.

Figure 12:
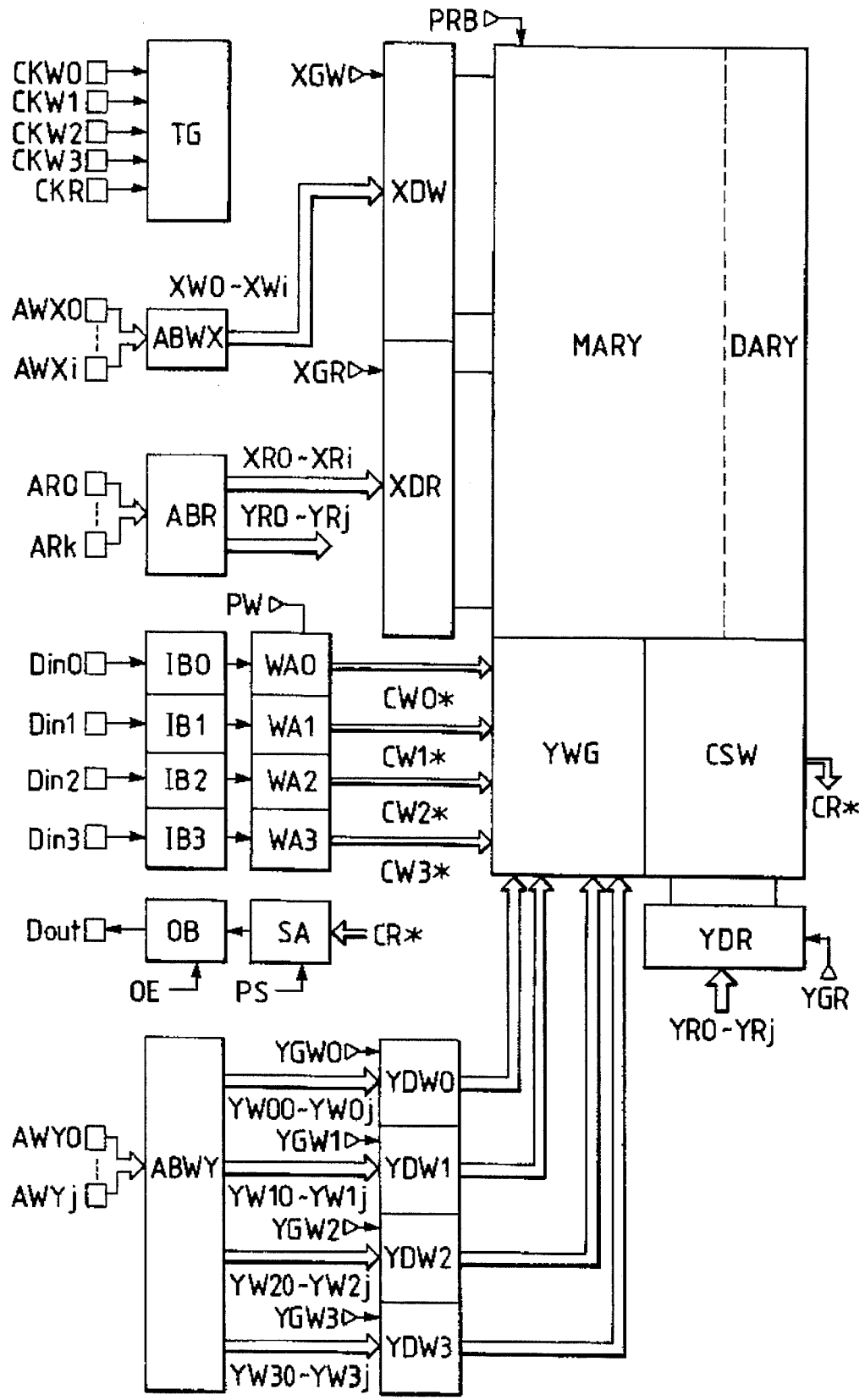
FIG. 12 is a block diagram indicating a third embodiment of a multi-port memory to which the invention is applied.

FIG. 12 indicates a block diagram of a third embodiment of a multi-port memory to which the present invention is applied. As the multi-port memory of this embodiment follows the multi-port memory in FIG. 9 basically, explanation for parts different from this will be added.

In FIG. 12, the multi-port memory of this embodiment is provided with one write Y address buffer ABWY, instead of the four write Y address buffers BWY0–BWY3 provided corresponding to each write port in the multi-port memory in FIG. 9. The write Y address buffer ABWY fetches and holds write Y address signals AWY0–AWYj of j+1 bits supplied from a front stage circuit (not shown), and counts up the write Y address signals according to inside control signal (not shown), thereby forms column addresses that are successive in the column direction and functions as so-called address generator. As a result, the multi-port memory of this embodiment can simplify its structure, obtaining effects similar to that of the multi-port memory in FIG. 9, and further, can promote low cost of the multi-port memory.

Figure 13:
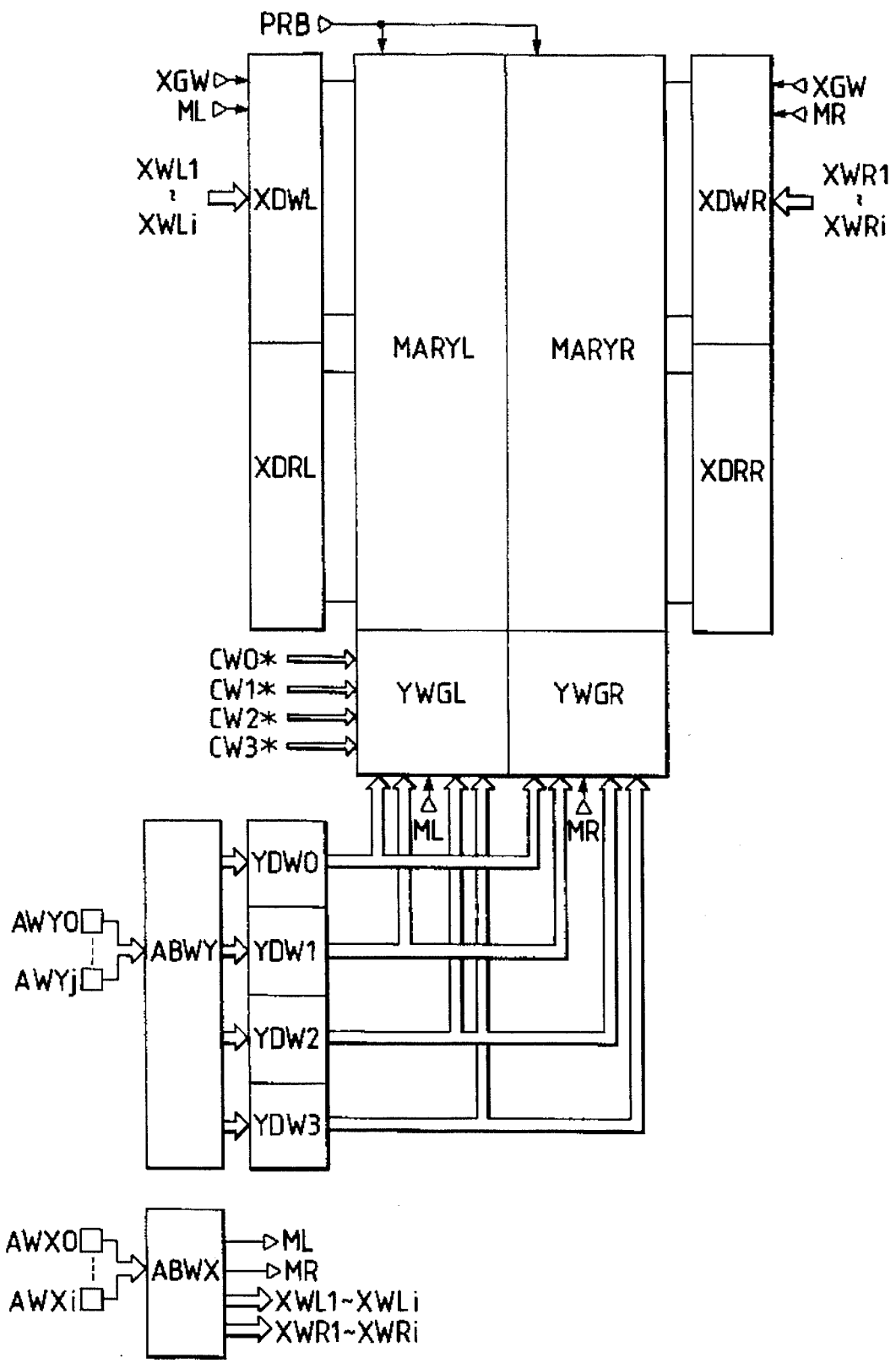
FIG. 13 is a block diagram indicating a fourth embodiment of a multi-port memory to which the invention is applied.

FIG. 13 indicates a block diagram of a fourth embodiment of a multi-port memory to which the present invention is applied. As the multi-port memory in this embodiment follows the multi-port memory in FIG. 12 basically, explanation for only parts different from this will be added. Also, although the multi-port memory of this embodiment is provided with one read port like prior embodiments, parts relating to this read port are omitted in FIG. 13.

In FIG. 13, the multi-port memory of this embodiment is provided with two memory arrays MARYL and MARYR, instead of the memory array MARY in FIG. 12, and is provided with write X address decoders XDWL and XDWR (column address decoders) and read X address decoders XDRL and XDRR and write gate circuits YWGL and YWGR corresponding to these memory arrays. Row addresses of even number are allotted to the memory array MARYL, and row addresses of odd number are allotted to the memory array MARYR.

The multi-port memory of this embodiment is provided with a write X address buffer ABWX (column address buffer) common to four write ports additionally. The write X address buffer ABWX forms inside control signal ML or MR selectively, according to the most significant bit of the given write X address signals AWX0–AWXi, and forms two sets of inside address signals XWL1–XWLi and XWR1–XWRi, based on remaining write X address signals of i bits. Among them, the inside address signals XWL1–XWLi are supplied to the write X address decoder XDWL corresponding to the memory array MARYL, and the inside address signals XWR1–XWRi are supplied to the write X address decoder XDWR corresponding to the memory array MARYR. Also, inside control signals ML and MR are supplied to the write gate circuits YWGL and YWGR respectively, thereby the write gate circuits YWGL and YWGR are set to operation condition selectively.

In this embodiment, the memory arrays MARYL and MARYR are accessible independently by the corresponding write X address decoders XDWL and XDWR, and write X word lines of each one piece are set to selection condition simultaneously. The write data of one bit are supplied alternatively to the memory cells of n+1 pieces coupled with the word lines selected in each memory array through the corresponding write gate circuit YWGL or YWGR, and the write operation is executed. The inside address signals XWL1–XWLi and XWR1–XWRi supplied to the write X address decoders are all set to the same row address, when the write operation for memory cells on the side of the memory array MARYL is executed, and the inside address signals XWL1–XWLi are ahead of the inside address signals XWR1–XWRi by one address, when the write operatic for memory cells on the side of the memory array MARYR is executed. As a result, in the multi-port memory of this embodiment, the successive accesses over a plurality of word lines are possible without having the selection operation of next word line.

As indicated in a plurality of embodiments described above, the present invention is applied to semiconductor memory devices like multi-port memories etc. used as a time switch of a time sharing digital exchanger, thereby following actions and effects are obtained.

(1) The memory cell of the multi-port memory is made a single selection type memory cell which is alternatively selected at least at the time of write operation, and one end of the write column selection MOSFET is terminated with, for example, the earth potential of the circuit, and the write column selection signal supplied to the gate is formed selectively according to at least the column selection address and the corresponding write data, thereby the write column selection MOSFET of the memory cell can function as a substantial write means.

(2) According to the above item (1), effect is gained in that the write paths for the memory cells are simplified, and level reduction of the write signal for the memory cells is suppressed, and the write operation margin of the multi-port memory can be enlarged.

(3) According to the above item (1), effect is gained in that the write column selection signal line serves also as a write data line, and the number of necessary signal lines of the memory array can be reduced.

(4) According to the above items (1)–(3), effect is gained in that the write operation of the multi-port memory is stabilized, and its low consumption power and low cost are promoted, and further the low voltage of the operation power source of the multi-port memory can be promoted.

(5) In the above items (1)–(4), effect is gained in that the read data lines with the memory cell constituting the memory array being connected thereto selectively are made a single signal line and dummy data lines with a dummy cell connected thereto selectively are provided, these read data lines and dummy data lines being coupled with a differential type sense amplifier, thereby the read operation of the multi-port memory is stabilized and the read data lines are made a single line and the number of necessary signal lines of the memory array can be further reduced.

(6) The multi-port memory due to the above items (1)–(5) is used as a fundamental constitution, and a multi-port memory having a plurality of write ports and having function executing the write operation for a plurality of addresses successive in the column direction in the time sharing is constituted, thereby effect of realizing the time switch having so-called multiplex function is gained in order that communication data transmitted through, for example, a plurality of highways are multiplexed on one super highway.

(7) According to the above item (6), effect is gained in that constitution of a time sharing digital exchanger including a multi-port memory is simplified, and its low cost and the high speed of the transmission rate can be promoted.

The present invention carried out by the inventor has been explained concretely on the basis of the embodiments, but the present invention is not limited to the above embodiments, and it is needless to say that various changes and modifications may be made in the invention without departing form the spirit and scope thereof. For example, in the block diagrams of FIG. 1, FIG. 9, FIG. 12 and FIG. 13, the multi-port memory can adopt both so-called array division system where the memory arrays MARY as well as MARYL and MARYR are divided into a plurality of submemory arrays or memory mats, and so-called multi-bit constitution where memory data of a plurality of bits are inputted and outputted simultaneously. Also, the multi-port memory may be provided with a plurality of read ports and one write port or a plurality of read ports and write ports, and each access port can be used as that for reading and writing. The number of read ports and write ports provided in the multi-port memory is not subject to the limitation by these embodiments. In FIG. 3, the memory cells MC constituting the memory array may be so-called high resistance load type static memory cells where, for example, P-channel MOSFET of the inverter circuits N1 and N2 is replaced by high resistance, and the constitution of the dummy cell DC included in the dummy array DARY is not subject to limitation due to the embodiment in FIG. 4. In these embodiments, the memory cells MC are selected singly only at the time of write operation, but may be selected singly also at the time of read operation. In FIG. 5 and FIG. 10, the logical constitution of the write gate circuit YWG can adopt various embodiments. Also, various embodiments can be realized like a block constitution of the multi-port memory and logic levels of start control signals and inside control signals etc. and combination of address signals.

The invention carried out by the present inventor has been mainly explained in the case that the invention is applied to a multi-port memory used as a time switch of the time sharing digital exchanger being the utilization field constituting the background thereof, but the invention is not limited to this. For example, it can be applied to a multi-port memory for other various uses and also various memory integrated circuit devices having a plurality of access ports. The present invention can be widely applied to the semiconductor memory devices provided with at least a plurality of access ports and digital integrated circuit devices containing such semiconductor memory devices.

The effects obtained by the typical invention disclosed in the present patent application will be briefly explained as follows. The memory cell of the multi-port memory is made a single selection type memory cell which is alternately selected at least at the time of write operation, and one end of the write column selection MOSFET is terminated with, for example, the earth potential of the circuit, and the write column selection signal supplied to the gate is formed selectively according to at least the column selection address and the corresponding write data. Also, the read data lines with the memory cell constituting the memory array being connected thereto selectively are made a single signal line and dummy data lines with a dummy cell connected thereto selectively are provided, and a differential type sense amplifier having a pair of input terminals connected to the read data lines and dummy data lines is uses. Further, the multi-port memory in such constitution is provided with a plurality of write ports and with function executing the write operation for a plurality of addresses successive in the column direction in the time sharing. Thereby the write column selection MOSFET of the memory cell can function as a substantial write means and the write operation margin of the multi-port memory can be enlarged, and the write column selection line serves also as a write data line and the number of necessary signal lines of the memory array can be reduced. Also the read operation of the multi-port memory is stabilized and the read data lines are made a single line, and the number of necessary signal lines of the memory array can be further reduced. Further, the multi-port memory has so-called multiplex function so that communication data transmitted through, for example, a plurality of highways are multiplexed on one super highway, and constitution of the time sharing digital exchanger can be simplified.

What is claimed is:

1. A semiconductor integrated circuit device comprising:
   a memory array,
   a plurality of write word lines,
   a plurality of data lines, and
   a plurality of memory cells, each being coupled to a corresponding one only of said plurality of write word lines and to a corresponding one of said plurality of data lines;
   a first address decoder for receiving signals based on a plurality of first address signals and for outputting a plurality of first data line selection signals;
   a second address decoder for receiving signals based on a plurality of second address signals and for outputting a plurality of second data line selection signals, said second address decoder being operable at the same time as said first address decoder;
   a write control circuit for selecting at least one data line from among all of said plurality of data lines in accordance with said plurality of first data line selection signals, and for selecting at least one data line from among all of said plurality of data lines in accordance with said plurality of second data line selection signals;
   a third data input portion for inputting a third input data and for outputting a third write data; and
   a third address decoder for receiving signals based on a plurality of third address signals and for outputting a plurality of third data line selection signals,
   wherein said write control circuit further outputs said third write data to one of said plurality of data lines in accordance with said plurality of third data line selection signals.

2. A semiconductor integrated circuit device comprising:
   a memory array,
   a plurality of write word lines,
   a plurality of data lines, and
   a plurality of memory cells, each being coupled to a corresponding one only of said plurality of write word lines and to a corresponding one of said plurality of write word lines;
   a first address decoder for receiving signals based on a plurality of first address signals and for outputting a plurality of first data line selection signals;
   a second address decoder for receiving signals based on a plurality of second address signals and for outputting a plurality of second data line selection signals, said second address decoder being operable at the same time as said first address decoder;
   a write control circuit for selecting at least one data line from among all of said plurality of data lines in accordance with said plurality of first data line selection signals, and for selecting at least one data line from among all of said plurality of data lines in accordance with said plurality of second data line selection signals;

a third address decoder for receiving signals based on a plurality of third address signals and for outputting a plurality of third data line selection signals; and wherein said write control circuit further selects at least one data line from among all of said plurality of data lines in accordance with said plurality of third data line selection signals.

3. A semiconductor integrated circuit device comprising:

a memory array comprising
- a plurality of write X word lines,
- a plurality of complementary Y lines, and
- a plurality of memory cells, each being coupled to a corresponding one only of said plurality of write X word lines and to a corresponding one pair of said plurality of complementary Y lines;

a first data input portion for inputting a first input data and for outputting a first write complementary data;

a second data input portion for inputting a second input data and for outputting a second write complementary data;

a first Y address decoder for receiving signals based on a plurality of first Y address signals and for outputting a plurality of first complementary Y line selection signals;

a second Y address decoder for receiving signals based on a plurality of second Y address signals and for outputting a plurality of second complementary Y line selection signals; and a write control circuit for outputting said first write complementary data to one pair from among all of said plurality of complementary Y lines in accordance with said plurality of first complementary Y line selection signals, and for outputting said second write complementary data to said one pair of said plurality of complementary Y lines in accordance with said plurality of second complementary Y line selection signals;

wherein each of said plurality of memory cells is a static type and comprises
- a first load element having one end coupled to receive a first supply voltage,
- a second load element having one end coupled to receive said first supply voltage,
- a first MOSFET having a gate coupled to the other end of said second load element and having a source-drain path coupled between the other end of said first load element and a second supply voltage,
- a second MOSFET having a gate coupled to the other end of said first load elements and having a source-drain path coupled between the other end of said second load elements and said second supply voltage; and
- a third MOSFET having a gate coupled to a corresponding one of said plurality of word lines and having a source-drain path coupled between one end of said source-drain path of said first MOSFET and a corresponding one of said plurality of date lines.

4. A semiconductor integrated circuit device according to claim 3, wherein said first load element comprises a fourth MOSFET having a gate coupled to said gate of said first MOSFET and having a source-drain path coupled between said first supply voltage and one end of said source-drain path of said first MOSFET, wherein said second load element comprises a fifth MOSFET having a gate coupled to said gate of said second MOSFET and having a source-drain path coupled between said first supply voltage and one end of said source-drain path of said second MOSFET, wherein said first, second and third MOSFET is of n-channel type MOSFET, and wherein said fourth and fifth MOSFET is of p-channel type MOSFET.

5. A semiconductor integrated circuit device comprising:

a memory array comprising
- a plurality of X write word lines,
- a plurality of complementary Y lines, and
- a plurality of memory cells, each being coupled to a corresponding one only of said plurality of X write lines and to a corresponding one pair of said plurality of complementary Y lines;

a first data input portion for inputting a first input data and for outputting a first write complementary data;

a second data input portion for inputting a second input data and for outputting a second write complementary data;

a first Y address decoder for receiving signals based on a plurality of first Y address signals and for outputting a plurality of first complementary Y line selection signals;

a second Y address decoder for receiving signals based on a plurality of second Y address signals and for outputting a plurality of second complementary Y line selection signals;

a write control circuit for outputting said first write complementary data to one pair from among all of said plurality of complementary Y lines in accordance with said plurality of first complementary Y line selection signals, and for outputting said second write complementary data to said one pair of said plurality of complementary Y lines in accordance with said plurality of second complementary Y line selection signals;

a third data input portion for inputting a third input data and for outputting a third write data; and a third Y address decoder for receiving signals based on a plurality of third Y address signals and for outputting a plurality of third data line selection signals, wherein said write control circuit further outputs said third write data to one of said plurality of complementary Y lines in accordance with said plurality of third data line selection signals.

6. A semiconductor integrated circuit device comprising:

a memory array,
- a plurality of write word lines,
- a plurality of data lines, and
- a plurality of memory cells, each being coupled to a corresponding one only of said plurality of write word lines and to a corresponding one of said plurality of data lines;

a first address decoder for receiving signals based on a plurality of first address signals and for outputting a plurality of first data line selection signals;

a second address decoder for receiving signals based on a plurality of second address signals and for outputting a plurality of second data line selection signals, said second address decoder being operable at the same time as said first address decoder;

a write control circuit for selecting at least one data line from among all of said plurality of data lines in accordance with said plurality of first data line selection signals, and for selecting at least one data line from among all of said plurality of data lines in accordance with said plurality of second data line selection signals;

wherein each of said plurality of memory cells is a static type and comprises a first load element having one end coupled to receive a first supply voltage, a second load element having one end coupled to receive said first supply voltage, a first MOSFET having a gate coupled to another end of said second load element and having a source-drain path coupled between the another end of said first load element and a second supply voltage, a second MOSFET having a gate coupled to the another end of said first load element and having a source-drain path coupled between the another end of said second load element and said second supply voltage, and a third MOSFET having a gate coupled to a corresponding one of said plurality of write word lines and having a source-drain path coupled between one end of said source-drain path of said first MOSFET and a corresponding one of said plurality of data lines.

7. A semiconductor integrated circuit device according to claim 6, wherein said first load element comprises a fourth MOSFET having a gate coupled to said gate of said first MOSFET and having a source-drain path coupled between said first supply voltage and one end of said source-drain path of said first MOSFET, wherein said second load element comprises a fifth MOSFET having a gate coupled to said gate of said second MOSFET and having a source-drain path coupled between said first supply voltage and one end of said source-drain path of said second MOSFET, wherein each of said first second and third MOSFET is an n-channel type MOSFET is a σ-channel type MOSFET.

8. A semiconductor integrated circuit device comprising:

a memory array,
a plurality of write word lines,
a plurality of data lines, and
a plurality of memory cells, each being coupled to a corresponding one only of said plurality of write word lines and to a corresponding one of said plurality of data lines;

a first address decoder for receiving signals based on a plurality of first address signals and for outputting a plurality of first data line selection signals;

a second address decoder for receiving signals based on a plurality of second address signals and for outputting a plurality of second data line selection signals, said second address decoder being operable at the same time as said first address decoder;

a write control circuit for selecting at least one data line from among all of said plurality of data lines in accordance with said plurality of first data line selection signals, and for selecting at least one data line from among all of said plurality of data lines in accordance with said plurality of second data line selection signals;

wherein each of said plurality of memory cells is a static type and comprises
a first load element having one end coupled to receive a first supply voltage,
a second load element having one end coupled to receive said first supply voltage,
a first MOSFET having a gate coupled to the other end of said second load element and having a source-drain path coupled between the other end of said first load element and a second supply voltage,
a second MOSFET having a gate coupled to the other end of said first load element and having a source-drain path coupled between the other end of said second load element and said second supply voltage, and
a third MOSFET having a gate coupled to a corresponding one of said plurality of write word lines and having a source-drain path coupled between one end of said source-drain path of said first MOSFET and a corresponding one of said plurality of data lines.

9. A semiconductor integrated circuit device according to claim 8, wherein said first load element comprises a fourth MOSFET having a gate coupled to said gate of said first MOSFET and having a source-drain path coupled between said first supply voltage and one end of said source-drain path of said first MOSFET, wherein said second load element comprise a fifth MOSFET having a gate coupled to said gate of said second MOSFET and having a source-drain path coupled between said first supply voltage and one end of said source-drain path of said second MOSFET, wherein each of said first, second and third MOSFET is an n-channel type MOSFET, and wherein each of fourth and fifth MOSFET is a p-channel type MOSFET.

10. A semiconductor integrated circuit device comprising:

a memory array, including
a plurality of write word lines,
a plurality of data lines, and
a plurality of memory cells, each being coupled to a corresponding one only of said plurality of write word lines and to a corresponding one of said plurality of data lines;

a first address decoder for receiving signals based on a plurality of first address signals and for outputting a plurality of first data line selection signals;

a second address decoder for receiving signals based on a plurality of second address signals and for outputting a plurality of second data line selection signals, said second address decoder being operable at the same time as said first address decoder; and a write control circuit for selecting at least one data line from among all of said plurality of data lines in accordance with said plurality of first data line selection signals, and for selecting at least one data line from among all of said plurality of data lines in accordance with said plurality of second data line selection signals.

11. A semiconductor integrated circuit device according to claim 10, including means for inputting said plurality of first address signals and said plurality of second address signals from outside of said semiconductor integrated circuit device.

12. A semiconductor integrated circuit device according to claim 10, further comprising:

a first address buffer for receiving said plurality of first address signals and for outputting a plurality of first inside address signals to said first address decoder; and a second address buffer for receiving said plurality of second address signals and for outputting a plurality of second inside address signals to said second address decoder.

13. A semiconductor integrated circuit device according to claim 10, further comprising a third address decoder for receiving signals based on a plurality of third address signals and for selecting one of said plurality of write word lines.

14. A semiconductor integrated circuit device according to claim 13, wherein each of said plurality of memory cells is of a static type.

15. A semiconductor integrated circuit device according to claim 13, including means for inputting said plurality of first address signals, said plurality of second address signals and said plurality of third address signals from outside of said semiconductor integrated circuit device.

16. A semiconductor integrated circuit device comprising:

a memory array, including
  a plurality of write word lines,
  a plurality of data lines, and
  a plurality of memory cells, each being coupled to a corresponding one only of said plurality of write word lines and to a corresponding one of said plurality of data lines;
a first data input portion for inputting first input data and for outputting first write data;
a second data input portion for inputting second input data and for outputting second write data;
a first address decoder for receiving signals based on a plurality of first address signals and for outputting a plurality of first data line selection signals;
a second address decoder for receiving signals based on a plurality of second address signals and for outputting a plurality of second data line selection signals, said second address decoder being operable at the same time as said first address decoder; and
a write control circuit for outputting said first write data to one data line from among all of said plurality of data lines in accordance with said plurality of first data line selection signals, and for outputting said second write data to one data line from among all of said plurality of data lines in accordance with said plurality of second data line selection signals.

17. A semiconductor integrated circuit device according to claim 16, further including means for inputting said first input data, said second input data, said plurality of first address signals and said plurality of second address signals from outside of said semiconductor integrated circuit device.

18. A semiconductor integrated circuit device according to claim 16, wherein said first data input portion comprises:

a first data input buffer for receiving said first input data and for outputting data based on said first input data; and
a first write amplifier for receiving said data based on said first input data and for outputting said first write data, and wherein said second data input portion comprises:
  a second data input buffer for receiving said second input data and for outputting data based on said second input data; and
  a second write amplifier for receiving said data based on said second input data and for outputting said second write data.

19. A semiconductor integrated circuit device according to claim 16, further comprising:

a first address buffer for receiving said plurality of first address signals and for outputting a plurality of first inside address signals to said first address decoder; and
a second address buffer for receiving said plurality of second address signals and for outputting a plurality of second inside address signals to said second address decoder.

20. A semiconductor integrated circuit device according to claim 16, further comprising a third address decoder for receiving signals based on a plurality of third address signals and for selecting one of said plurality of write word lines.

21. A semiconductor integrated circuit device according to claim 20, wherein each of said plurality of memory cells is of static type.

22. A semiconductor integrated circuit device according to claim 20, further including means for inputting said first input data, said second input data, said plurality of first address signals, said plurality of second address signals and said plurality of third address signals from outside of said semiconductor integrated circuit device.

23. A semiconductor integrated circuit device according to claim 20, wherein said write control circuit comprises:

a first common line to which said first write data is inputted,
a second common line to which said second write data is inputted,
a plurality of first gate circuits each of which is coupled between said first common line and a corresponding one of said plurality of data lines, one of said plurality of first gate circuits transmitting data based on said first write data on said first common line to a corresponding one of said plurality of data lines in accordance with said first data line selection signals, and
a plurality of second gate circuits each of which is coupled between said second common line and a corresponding one of said plurality of data lines, one of said plurality of second gate circuits transmitting data based on said second write data on said second common line to a corresponding one of said plurality of data lines in accordance with said second data line selection signals.

24. A semiconductor integrated circuit device comprising:

a memory array comprising
  a plurality of write X word lines,
  a plurality of complementary Y lines, and
  a plurality of memory cells, each being coupled to a corresponding one only of said plurality of write X word lines and to a corresponding one pair of said plurality of complementary Y lines;
a first data input portion for inputting a first input data and for outputting a first write complementary data;
a second data input portion for inputting a second input data and for outputting a second write complementary data;
a first Y address decoder for receiving signals based on a plurality of first Y address signals and for outputting a plurality of first complementary Y line selection signals;
a second Y address decoder for receiving signals based on a plurality of second Y address signals and for outputting a plurality of second complementary Y line selection signals; and
a write control circuit for outputting said first write complementary data to one pair from among all of said plurality of complementary Y lines in accordance with said plurality of first complementary Y line selection signals, and for outputting said second write complementary data to said one pair of said plurality of complementary Y lines in accordance with said plurality of second complementary Y line selection signals.

25. A semiconductor integrated circuit device according to claim 24, wherein said write control circuit comprises:

a first complementary common line to which said first write complementary data are inputted,
a second complementary common line to which said second write complementary data are inputted, a plurality of first gate circuits each of which is coupled between said first complementary common lines and a corresponding one pair of said plurality of complementary Y lines, one of said plurality of first gate circuits transmitting data based on said first write complementary data on said first complementary common lines to a corresponding one pair of said plurality of complementary Y lines in accordance with said plurality of first complementary Y selection signals, and a plurality of second gate circuits each of which is coupled between said second complementary common lines and a corresponding one pair of said plurality of complementary Y lines, one of said plurality of second gate circuits transmitting data based on said second write complementary data on said second complementary common lines to a corresponding one pair of said plurality of complementary Y lines in accordance with said plurality of second complementary Y selection signals.

26. A semiconductor integrated circuit device according to claim 24, further comprising means for inputting said first input data, said second input data, said plurality of first Y address signals and said plurality of second Y address signals from outside of said semiconductor integrated circuit device.

27. A semiconductor integrated circuit device according to claim 24, wherein said first data input portion comprises:

a first data input buffer for receiving said first input data and for outputting data used on said first input data; and a first write amplifier for receiving said data based on said first input data and for outputting said first write data, and wherein said second data input portion comprises:

a second data input buffer for receiving said second input data and for outputting data based on said second input data; and a second write amplifier for receiving said data based on said second input data and for outputting said second write data.

28. A semiconductor integrated circuit device according to claim 24, further comprising:

a first Y address buffer for receiving said plurality of first Y address signals and for outputting a plurality of first inside address signals to said first Y address decoder; and a second Y address buffer for receiving said plurality of second Y address signals and for outputting a plurality of second inside address signals to said second Y address decoder.

29. A semiconductor integrated circuit device according to claim 24, further comprising an X address decoder for receiving signals based on a plurality of X address signals and for selecting one of said plurality of write X word lines.

30. A semiconductor integrated circuit device according to claim 29, wherein each of said plurality of memory cells is of static type.

31. A semiconductor integrated circuit device according to claim 29, further comprising means for inputting said first input data, said second input data, said plurality of first Y address signals, said plurality of second Y address signals and said plurality of X address signals from outside of said semiconductor integrated circuit device.

* * * * *